United States Patent
Ou et al.

(10) Patent No.: US 9,362,119 B2
(45) Date of Patent: Jun. 7, 2016

(54) METHODS FOR INTEGRATED CIRCUIT DESIGN AND FABRICATION

(71) Applicant: Taiwan Semiconductor Manufacturing Company, Ltd., Hsin-Chu (TW)

(72) Inventors: Tsong-Hua Ou, Taipei (TW); Ken-Hsien Hsieh, Taipei (TW); Shih-Ming Chang, Hsinchu County (TW); Wen-Chun Huang, Tainan (TW); Chih-Ming Lai, Hsinchu (TW); Ru-Gun Liu, Hsinchu County (TW); Tsai-Sheng Gau, HsinChu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/262,432

(22) Filed: Apr. 25, 2014

(65) Prior Publication Data

US 2015/0311063 A1    Oct. 29, 2015

(51) Int. Cl.
*H01L 21/311* (2006.01)
*H01L 21/027* (2006.01)
*H01L 21/321* (2006.01)

(52) U.S. Cl.
CPC ........ *H01L 21/0274* (2013.01); *H01L 21/3212* (2013.01)

(58) Field of Classification Search
CPC ............ H01L 21/0337; H01L 21/0338; H01L 23/564; H01L 21/3088; H01L 21/0335; H01L 21/3086; H01L 21/31144; H01L 27/1052; H01L 21/32139; H01L 21/76816; H01L 21/0273
USPC .......................... 438/694–696, 703, 706, 669
See application file for complete search history.

(56) References Cited

U.S. PATENT DOCUMENTS

2010/0130013 A1* 5/2010 Liu et al. .................. 438/693
2013/0264622 A1* 10/2013 Lin et al. .................. 257/314

* cited by examiner

*Primary Examiner* — Dung Le
(74) *Attorney, Agent, or Firm* — Haynes and Boone, LLP

(57) ABSTRACT

The present disclosure provides a method of patterning a target material layer over a semiconductor substrate. The method includes steps of: forming a plurality of first features over the target material layer using a first sub-layout, with each first feature having sidewalls; forming a plurality of spacer features, with each spacer feature conforming to the sidewalls of one of the first features and having a spacer width; and forming a plurality of second features over the target material layer using a second sub-layout. The method further includes steps of removing the plurality of spacer features from around each first feature and patterning the target material layer using the plurality of first features and the plurality of second features. Other methods and associated patterned semiconductor wafers are also provided herein.

13 Claims, 12 Drawing Sheets

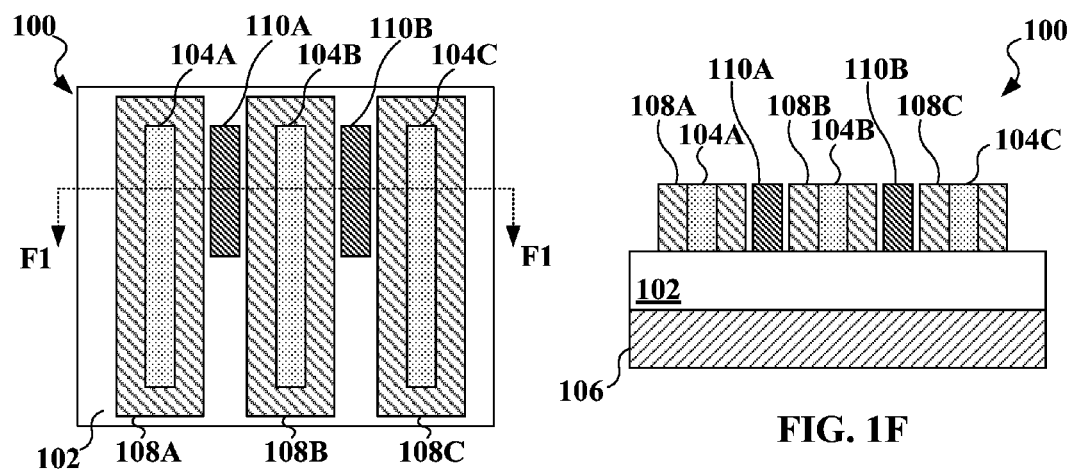
FIG. 1E
FIG. 1F
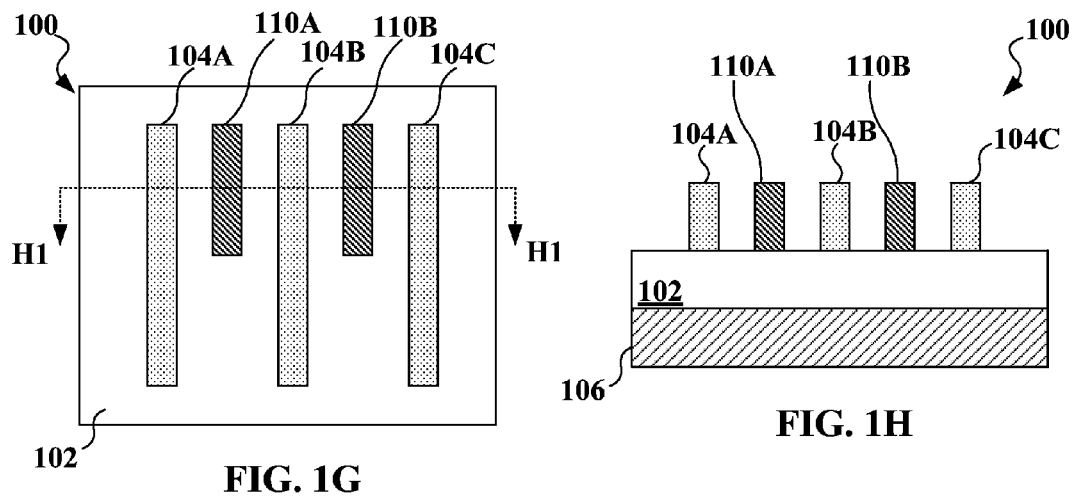
FIG. 1G
FIG. 1H

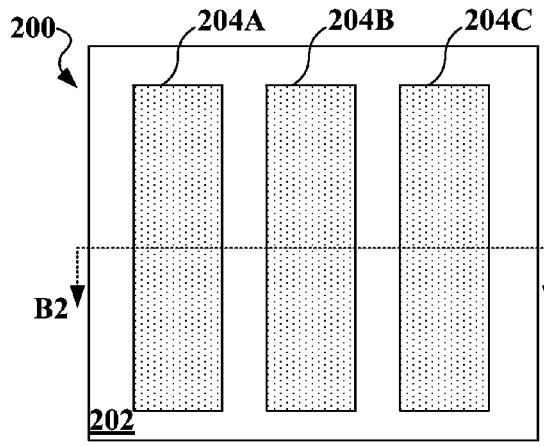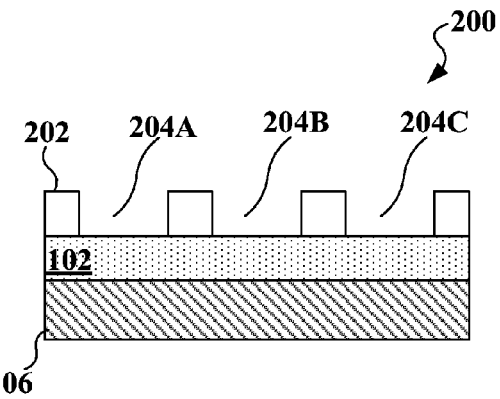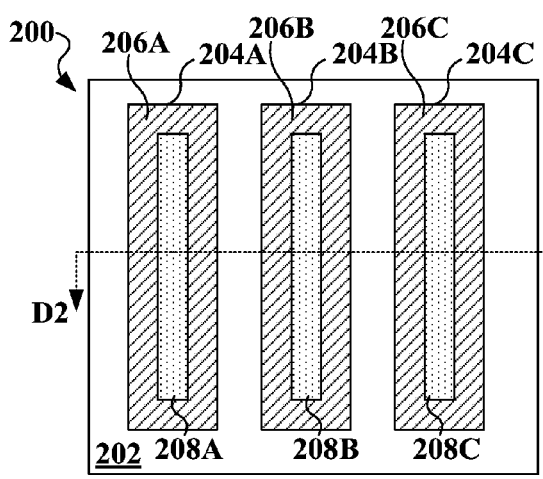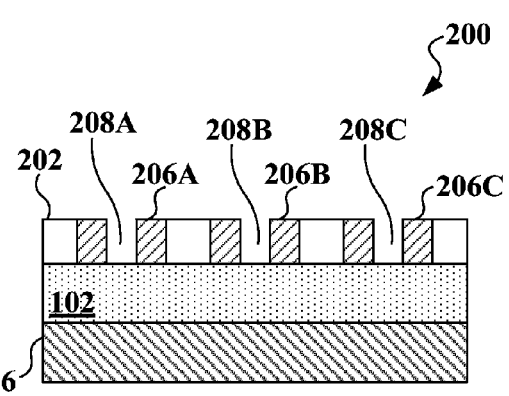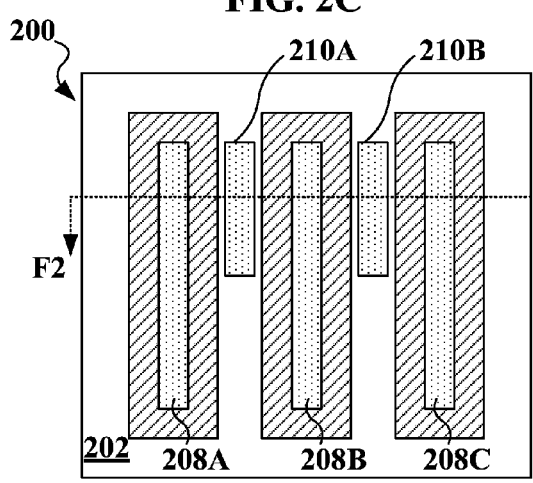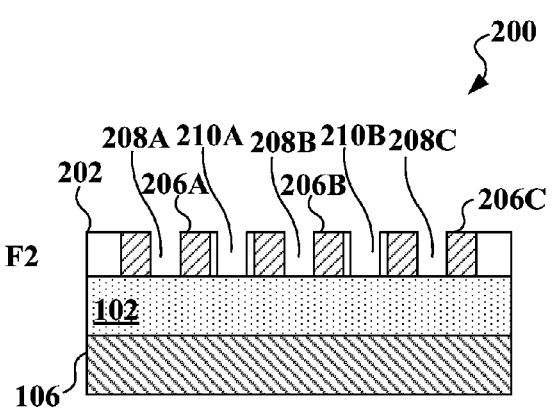

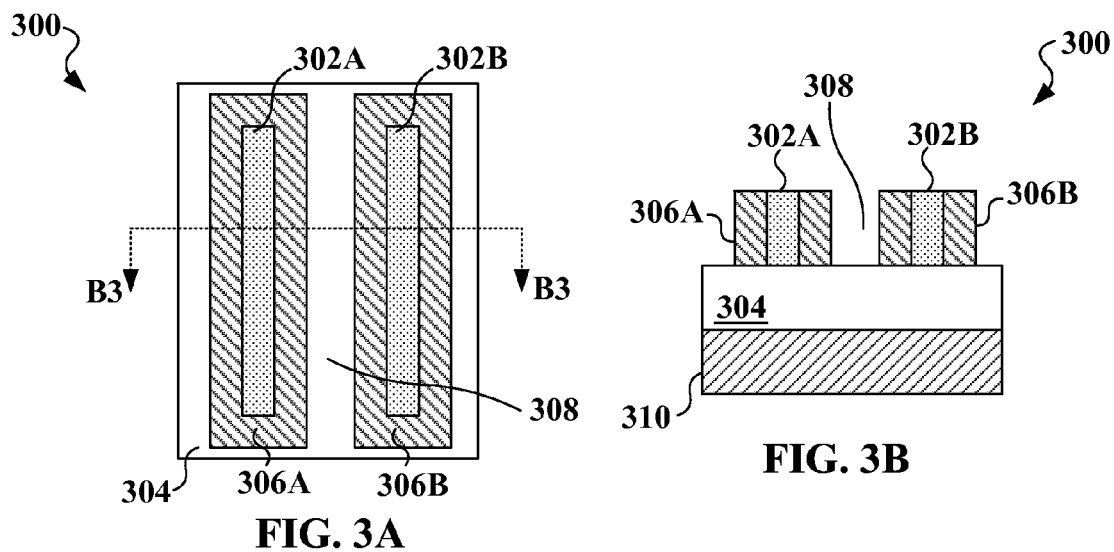
FIG. 3A
FIG. 3B
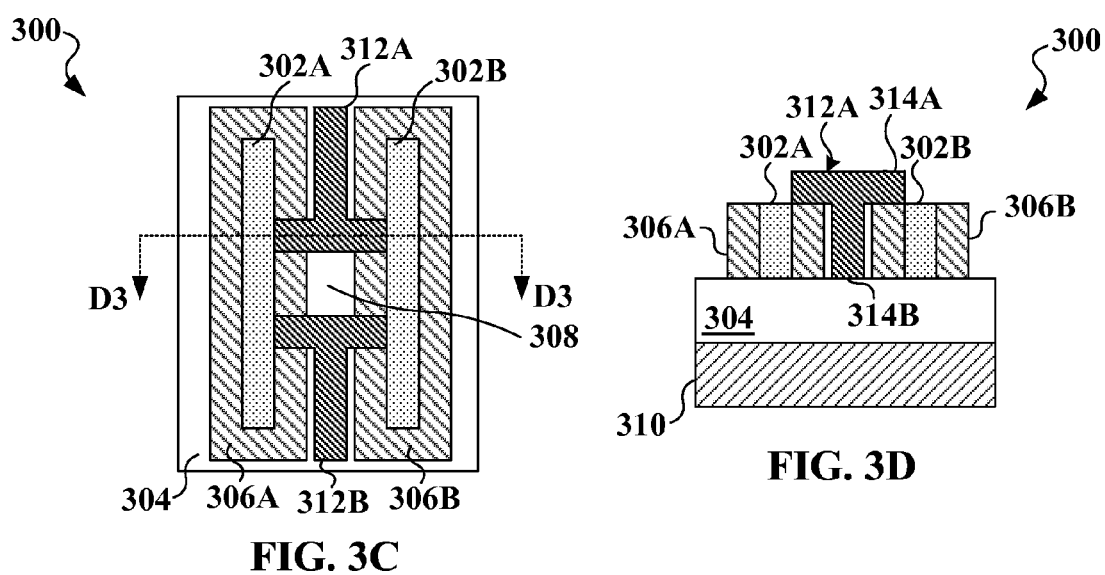
FIG. 3C
FIG. 3D

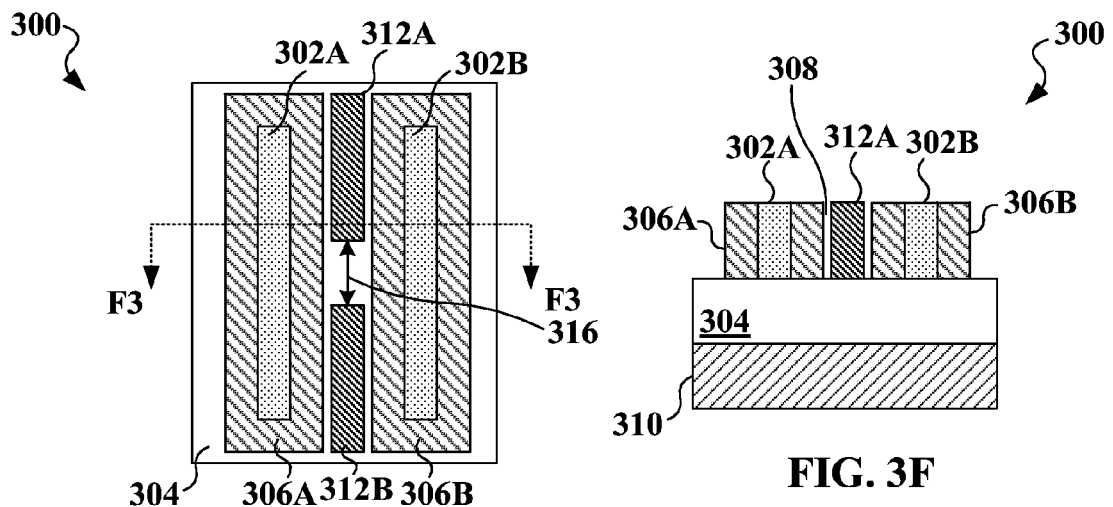
FIG. 3E
FIG. 3F
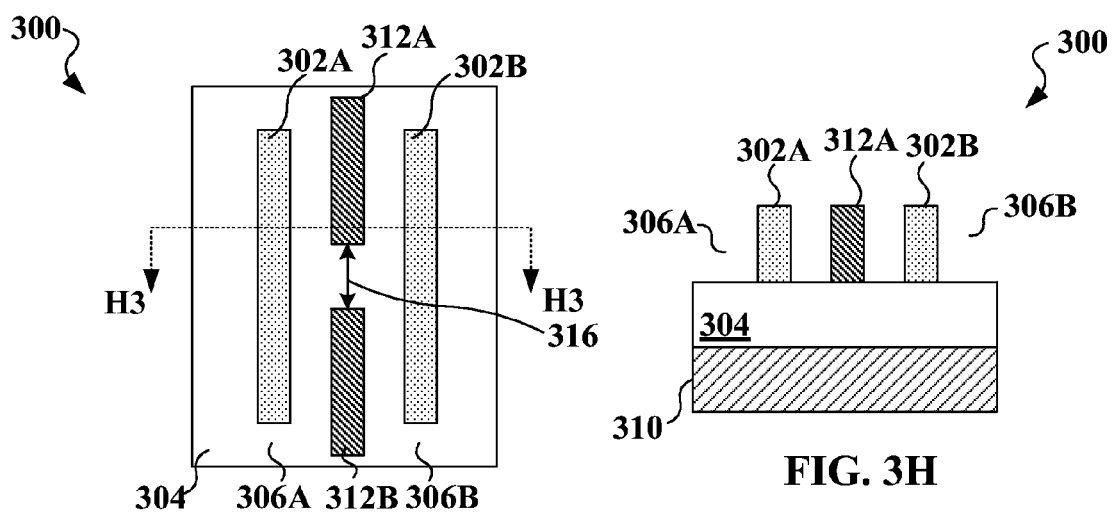
FIG. 3G
FIG. 3H

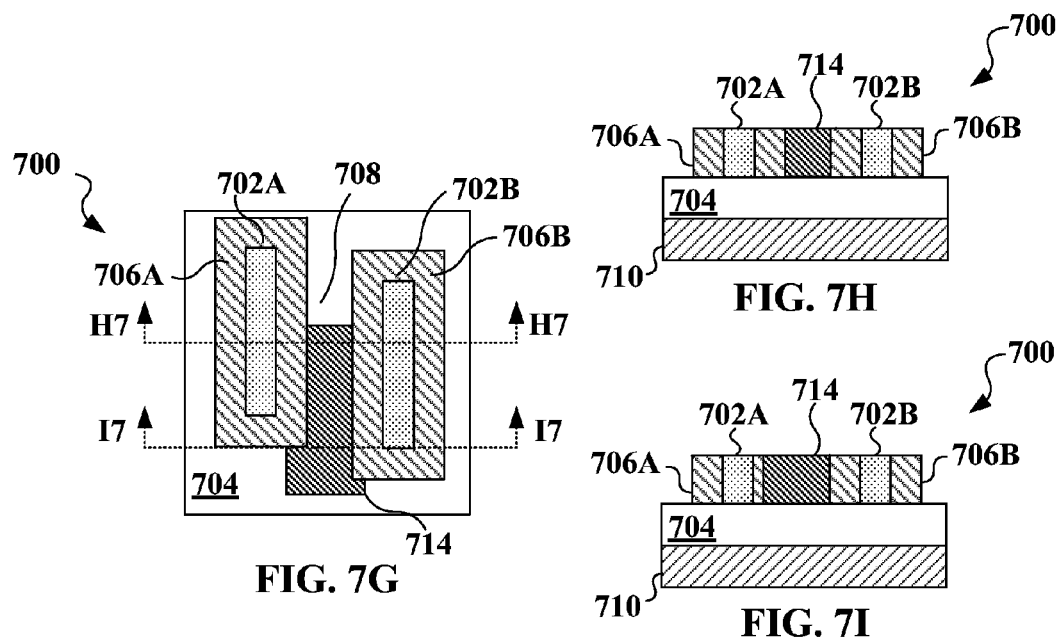
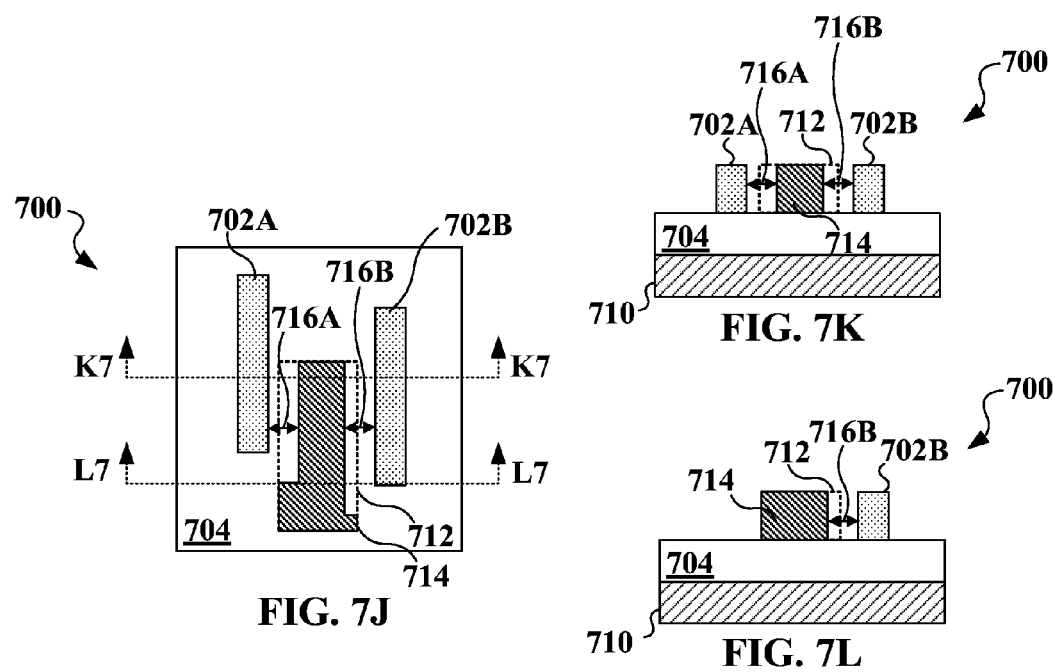

METHODS FOR INTEGRATED CIRCUIT DESIGN AND FABRICATION

BACKGROUND

The semiconductor integrated circuit industry has experienced rapid growth over the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Semiconductor fabrication relies heavily on the process of photolithography, in which light of a given frequency is used to transfer a desired pattern onto a wafer undergoing semiconductor processing. To transfer the pattern onto the wafer, a photomask is used. The photomask permits and prevents light in a desired layout onto a layer of the wafer, such as a photoresist (PR) mask, which chemically reacts to the light exposure to remove some portions of the PR mask and leaving other portions. The remaining PR mask is then used to pattern an underlying layer, which sometimes is used to pattern another underlying layer. As feature sizes have decreased, the wavelength of light used in photolithography to pattern mask layers has decreased as well, creating additional difficulties and necessitating technological advances such as the use of EUV as a light source, phase-shifting masks, and other advances.

In some instances, multiple masks may be used to form the features of a single desired layout. Each of the multiple masks is used to create different features contained within the desired layout. However, using multiple masks to achieve a single layout can be problematic. If two adjacent features, each from a different submask, are formed too close to each other unwanted electrical connections may be formed or desired connections may not be formed. Some processes, such as self-aligned double patterning (SADP) attempt to remedy such problems, but attempts to do so by introducing a number of constraints.

Thus, the current techniques have not been satisfactory in all respects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 1A, 1B, 1C, 1D, 1E, 1F, 1G and 1H present fragmentary views of a semiconductor wafer during a fabrication process according to one or more embodiments of the present disclosure.

FIGS. 2A, 2B, 2C, 2D, 2E, and 2F present fragmentary views of a semiconductor wafer during an additional fabrication process according to one or more embodiments of the present disclosure.

FIGS. 3A, 3B, 3C, 3D, 3E, 3F, 3G, and 3H present fragmentary views of a semiconductor wafer during an additional fabrication process with an end-to-end feature according to one or more embodiments of the present disclosure.

FIGS. 7A, 7B, 7C, 7D, 7E, 7F, 7G, 7H, 7I, 7J, 7K, and 7L present fragmentary views of a semiconductor wafer during a fabrication process according to one or more embodiments of the present disclosure.

Figure 1A:
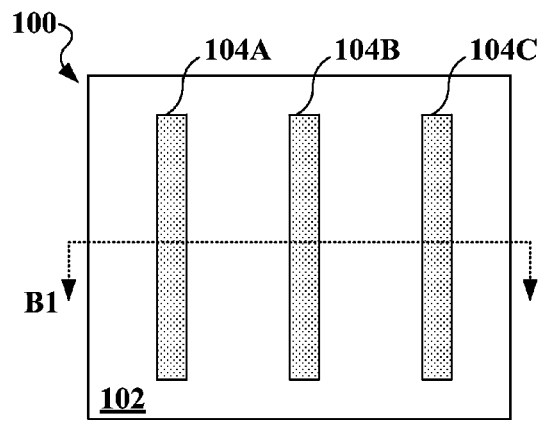

These figures are better understood by reference to the Detail Description included below.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples for simplicity and clarity. This repetition does not in itself dictate a relationship between the various embodiments and/or configurations discussed. Moreover, the performance of a first process before a second process in the description that follows may include embodiments in which the second process is performed immediately after the first process as well as embodiments in which additional processes may be performed between the first and second processes. Accordingly, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for the sake of simplicity and clarity. Many of the figures referred to herein are fragmentary in nature, showing only a portion of a substrate in which other processes may be performed and other structures and devices formed.

Further, spatially relative terms, such as "beneath," "below," "lower," "above," "upper" and the like, may be used herein for ease of description to describe one element or feature's relationship to another element(s) or feature(s) as illustrated in the figures. The apparatus may be otherwise oriented (rotated 90 degrees or at other orientations) and the spatially relative descriptors used herein may likewise be interpreted accordingly.

Figure 1B:
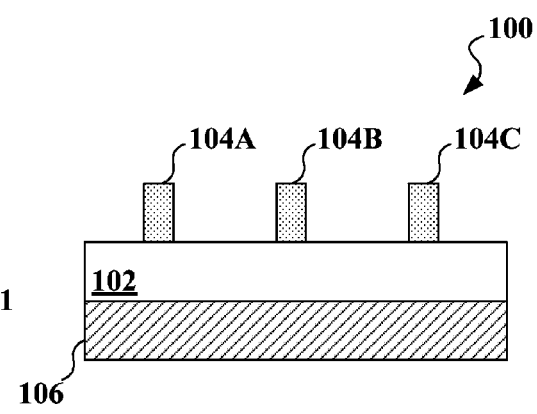

Referring now to FIGS. 1A-1F, a sequence of top views and cross-sectional views of a wafer 100 of the present disclosure is illustrated. Only a portion of the wafer 100 is illustrated and described herein. FIG. 1A is a top view of the wafer 100 and depicts a material layer 102 with a plurality of parallel features thereon. The parallel features 104A, 104B, and 104C may be formed according to a desired layout. Due to the size of one or more of the features in the desired layout, the desired layout may not be transferrable to a material layer, like material layer 102, in a single photolithography step. Therefore, the desired layout may be decomposed in to two or more sub-layouts that may be realized as two or more photomasks that are referred to herein as submasks. Features 104A, 104B, and 104C are formed according to a single submask in a photolithographic process in which a photoresist is applied on a target layer, such as material layer 102, and selectively exposed using the submask, and developed to provide masking features as illustrated. By using the features 104A-C during an etching process, the features may be transferred to the underlying material layer 102. FIG. 1B illustrates a cross-section of the wafer 100 according to FIG. 1A as seen along the line B1-B1. FIG. 1B also depicts a substrate 106 of the wafer 100.

Many different materials may be used in embodiments of the wafer 100. For example, the substrate 106 may be a silicon substrate, or made from strained silicon, silicon-on-insulator (SOI), or other suitable substrates. The photoresist used in forming the features 104A-C may be a positive or negative photoresist. And the material layer 102 may be an insulating layer, such as a silicon oxide or silicon nitride layer, or a conductive layer, such as a metal layer or a doped polysilicon layer, or another type of material layer.

Figure 1C:
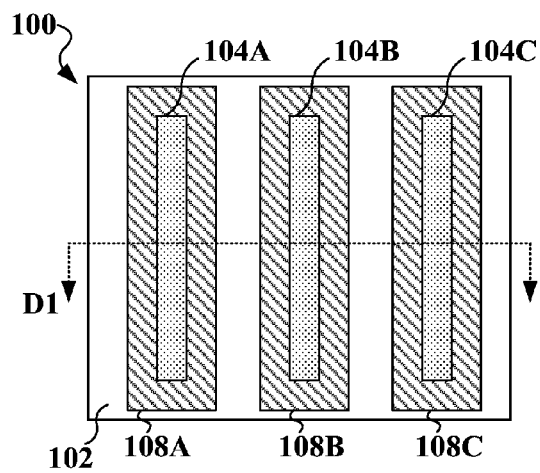
Figure 1D:
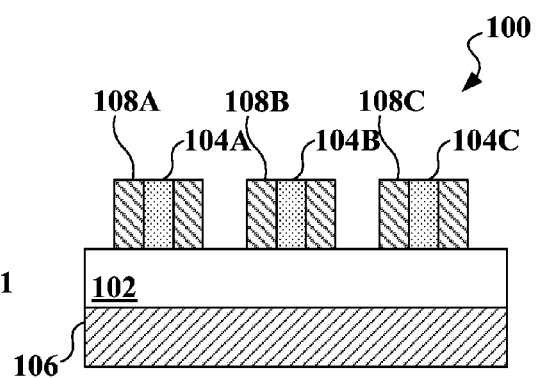

FIGS. 1C and 1D illustrate the wafer 100 with a plurality of spacer features or spacers around each of the features 104A-C. FIG. 1C illustrates the wafer 100 from above, while FIG. 1D is a cross-sectional view taken along line D1-D1. A spacer 108A surrounds feature 104A, spacer 108B surrounds feature 104B, and spacer 108C surrounds feature 104C. The spacers 108A-C may be formed by a process of material deposition and subsequent etching. For example, a silicon oxide layer may be formed over the patterned features 104A-C. The silicon oxide layer is formed on horizontal surfaces provided by the material layer 102 and the tops of the patterned features 104A-C and also on the sidewalls of the patterned features 104A-C. An etch process is then used to remove the silicon oxide layer from the horizontal surfaces, leaving the silicone oxide layer on the sidewalls. A chemical-mechanical planarization/polishing (CMP) process may be used to remove any of the deposited material that is directly above the features 104A-C. Thus, FIGS. 1C and 1D illustrate the features 104A-C as having sidewalls in contact with the spacers 108A-C and exposed top surfaces.

Referring to FIGS. 1E and 1F, after the formation of the spacers 108A-C, an additional material layer is deposited over the material layer 102, the features 104A-C, and the spacers 108A-C. Some of this additional material layer is deposited in gaps in between the spacers 108A and 108B and between spacers 108B and 108C. The additional material layer is then patterned by a photolithographic process using an additional submask to form additional features 110A and 110B. The additional material layer may be a photoresist or other polymer layer. Additional feature 110A is situated between the spacers 108A and 108B, but may be patterned so that there is no contact between the additional feature 110A and the spacers 108A and 108B. A separation distance between the spacers and the additional features may range from about 0 nanometers to about 20 nanometers or more. Similarly, the additional feature 110B is formed between the spacers 108B and 108C without contacting either spacer. Thus, the width and length of the additional features 110A and 110B may not be determined by the geometries of the spacers 108A-C or the geometries of the gaps therebetween, in some embodiments. In embodiments where the separation distance is zero, i.e. there is contact between the additional feature and spacers 108A and 108B, the additional features 110A and/or 110B may be shaped in part by the spacer 108A-C. For example, in the event that there is an overlay error produced by misalignment of the submask and the additional submasks, the spacers 108A-C may prevent any portion of the additional features 110A and 110B from getting close enough to the features 104A-C to cause any electrical problems by contact or by proximity. In such an event that a misalignment would cause the additional features 110A and 110B to overlap, a notch may result in the additional feature, but the spacer width of separation would remain.

After the additional features 110A and 110B are formed, the spacers 110A-C may be removed by a selective, chemical etch process. After this etch process, the additional features 110A and 110B and the features 104A-C remain on the surface of the material layer 102. In combination, the features 104A-C and additional features 110A and 110B form the desired layout that was decomposed into two submasks. In some embodiments, more than two submasks may be used. In such embodiments, an additional spacer may be added before the use of each additional submask employed in patterning the material layer 102. Using features 104A-C and 110A and 110B as masking features, the material layer 102 may be patterned by a chemical and/or physical etch process, thereby transferring the desired layout to the material layer 102. The use of the two submasks may permit additional control with respect to both submasks while avoiding the more significant problems caused by overlay errors or critical dimension problems.

FIGS. 2A-2F illustrate a sequence of top views and cross-sectional views of a fragmentary portion of a wafer 200 of the present disclosure. As illustrated in FIG. 2A, the wafer 200 includes a masking layer 202 on top of a material layer 102. The material layer 102 is disposed over a substrate 106, which is visible through a plurality of trenches. The plurality of trenches includes trenches 204A, 204B, and 204C. The trenches 204A-C may be formed by a photolithographic process, including photoresist layer formation, patterned exposure using a submask, development, and etching. FIG. 2B shows the wafer 200 in cross-section along a line B2-B2 as seen in FIG. 2A.

FIGS. 2C and 2D illustrate the wafer 200 after spacer features or spacers 206A, 206B, and 206C. The spacers 206A-C are each formed in one of the trenches 204A-C. The spacers 206A may be formed by the deposition of a material layer over the wafer 200 as illustrated in FIGS. 2A and 2B. The deposited material layer covers the masking layer 202 and the exposed portions of the material layer 102 in the bottom of trenches 204A-C. The deposited material layer is then patterned using an etch process to re-expose portions of the trenches 204A-C and other horizontal features on wafer 200, leaving portions of the deposited material layer on the sidewalls of the trenches 204A-C. The exposed portions 208A, 208B, and 208C may be centered within and defined by the spacers 206A-C. A back etch or a CMP process may be used to remove the deposited material layer from over the masking layer 202. FIG. 2D shows the wafer 200 of FIG. 2C in cross-sectional viewed along a line D2-D2 of FIG. 2C.

FIGS. 2E and 2F illustrate the wafer 200 after an additional etch process is used to form additional trench features 210A and 210B. This may be done by covering the wafer 200 as seen in FIGS. 2C and 2D with a photoresist layer and/or a hardmask, opening a window corresponding to a submask including the geometry of the features 210A and 210B, and then using a wet or dry etch to form the features 210A and 210B below the remaining photoresist layer. Like the exposed portions 208A-C, features 210A and 210B expose portions of the material layer 102 situated below the masking layer 202. After the photoresist layer is removed, the exposed portions 208A-C and features 210A and 210B are trenches in the masking layer 202. The exposed portions 208A-C and the additional trench features 210A and 210B may then be used to permit an etch process to act upon the material layer 102, thereby removing material and patterning the layer, or to deposit material in the trenches to form interconnects or other features. A single layout may be decomposed to produce the exposed portions 208A-C from one submask, and the additional trench features 210A and 210B from another submask. Yet another submask may be used in the formation of the trenches 204A-C as shown in FIGS. 2A and 2B. The etch used to form the additional trench features 210A and 210B is a selective etch, such that the spacers 206A-C are not removed during the etch process. Accordingly, a misalignment in the submasks may not cause the trench features 210A or 210B to be formed any closer to the exposed portions 204A-C that the width of the spacers 206A-C.

FIGS. 3A-F illustrate the formation of an end-to-end feature that may be problematic to form using traditional methods. As illustrated in FIGS. 3A and 3B, a wafer 300 (only a portion of which is shown) includes two parallel features 302A and 302B that are formed over a material layer 304. Each of the features 302A and 302B is surrounded by a spacer similar to the spacers 108A-C of FIGS. 1C-F. Feature 302A is surrounded by a spacer 306A, and feature 302B is surrounded by a spacer 306B. Between the features 302A and 302B, there is a gap 308 defined between and by the spacers 306A and 306B. The gap is seen in cross-section in FIG. 3B, which illustrates a cross-section of the wafer 300 through the line B3-B3. FIG. 3B also illustrates that the material layer 304 is situated over a substrate 310.

As illustrated, a width of the spacer 306A and a width of the spacer 306B is substantially the same. However, in some embodiments according to the present disclosure, spacer 306A may have a smaller width than that of spacer 306B or spacer 308B may have a smaller width than spacer 306A.

FIGS. 3C and 3D illustrate the wafer 300 after a material layer is deposited and patterned to form additional features 312A and 312B. When the material layer is deposited, some is deposited over the features 302A and 302B and the spacers 306A and 306B. Other portions of the material layer are deposited over the material 304, including in the gap 308. Thus, after patterning the material layer to form the additional features 312A and 312B, a portion of each of the features 312A and 312B is found in the gap 308, while orthogonal portions are formed over the spacers 306A and 306B. In some embodiments, the orthogonal portions extend over the features 302A and 302B. Additionally, in some embodiment there gap 308 is absent, such that the length of the additional features 312A and 312B are in contact with the spacers 306A and 306B. Thus, the additional features 312A and 312 may be described as T-shaped features, having the tops of both T-shapes proximate each other as illustrated in FIG. 3C. FIG. 3D illustrates the feature 312A in cross-section along a line D3-D3 of FIG. 3C. The cross-sectional view of FIG. 3D shows the orthogonal portion 314A extending over the spacers 306A and 306B, as well as the portion 314B of feature 312A situated within the gap 308.

FIGS. 3E and 3F illustrate the wafer 300 after a back etch or CMP process is used to remove the orthogonal portions of both additional features 312A and 312B, which are no longer T-shaped. However, the orthogonal portions may provide for improved transfer of an end-to-end spacing 316 between features 312A and 312B as illustrated in FIG. 3E. The end-to-end spacing 316 may be a distance of about 90 nanometers or more. The cross-sectional view shown in FIG. 3F is seen along the line F3-F3 of FIG. 3E. As illustrated, there is a space between the features 312A and 312B and the spacers 306A and 306B on either side. As such a width of the features 312A and 312B may be controlled and formed independently of the spacers 306A and 306B and the gap 308 therebetween. However, the spacers 306A and 306B may prevent the formation of the feature 312A and/or 312B to close to the features 302A and 302B. As seen in FIGS. 3G and 3H, the spacers 306A and 306B may be removed subsequently by a selective etch process after which the features 302A, 302B, 312A, and 312B may be a replication of the desired layout. The features 302A, 302B, 312A, and 312B may then be used as masking features to pattern the material layer 304.

Figure 4A:
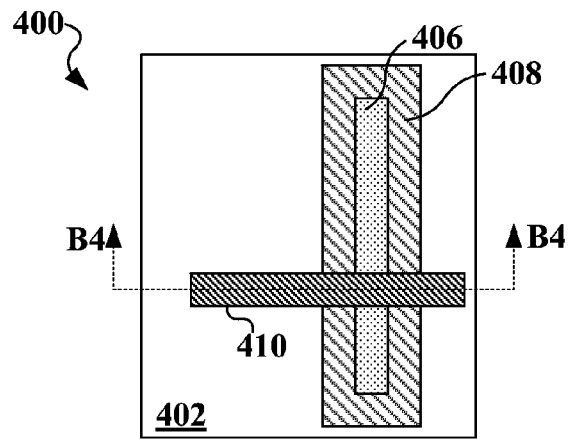
FIGS. 4A, 4B, 4C, 4D, 4E, and 4F present fragmentary views of a semiconductor wafer that includes a plurality of trenches during an additional fabrication process according to one or more embodiments of the present disclosure that results in a small island feature.

FIGS. 4A-F illustrate a portion of a wafer 400 during a number of stages during fabrication of an island portion that is too small to reliable produce by traditional method. The wafer 400 shares a number of features described above in connection with wafers 100, 200, and 300. FIG. 4A is a top view of a portion of the wafer 400, which includes a material layer 402 on top of a substrate 404. As illustrated, there is a vertical feature 406, situated over the material layer 402, that is surrounded by a spacer feature or spacer 408 having a spacer width. An orthogonal feature 410 is formed over the material layer 402, a portion of the feature 406, and a portion of the spacer 408. This may be done by depositing a material layer of the orthogonal feature 410 over the wafer 400 and then patterning the layer through an etch process into the shape seen in FIG. 4C. A portion of the feature 410 is on the left side of the feature 406 and the spacer 408, while a smaller portion of the feature 410 is on the right side, as viewed from above in FIG. 4A. This is also seen in the cross-sectional view of FIG. 4B, which is a cross-sectional view along the line B4-B4 of FIG. 4A. As used herein, "vertical" is used to describe the illustrated embodiments only and to provide a descriptive relationship to the orthogonal feature. Thus, the vertical feature 406, and other vertical features described below, do not require any particular orientation over a material layer.

Figure 4B:
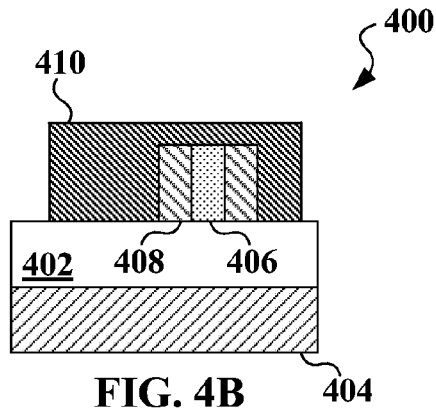
Figure 4C:
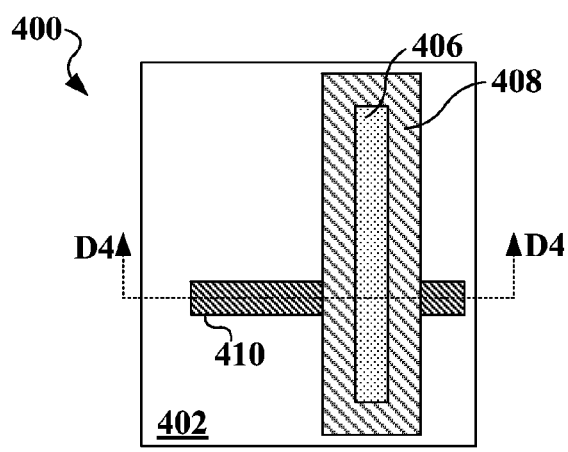
Figure 4D:
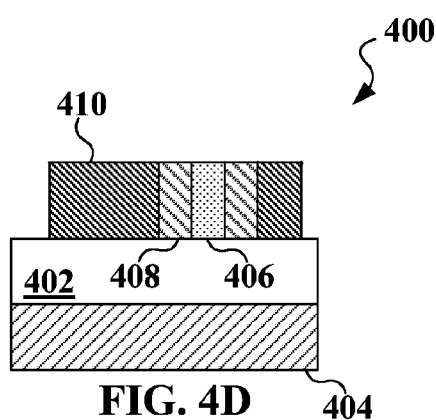

FIGS. 4C and 4D illustrate the wafer 400 after a back etch or CMP process is used to remove the portion of the feature 410 that was over the spacer 408 and the vertical feature 406. As can be seen in FIG. 4C, the orthogonal feature 410 is "cut" by the feature 406, the spacer 408, and the removal of the portions of the orthogonal feature 410 that were over those features. The orthogonal feature 410 is divided into an orthogonal feature 410A and an orthogonal feature 410B. The orthogonal feature 410B may be an "island" feature, and the dimensions thereof may be smaller than can be directly realized through a traditional photolithographic process, such as that which resulted in the orthogonal feature 410. The cross-sectional view of FIG. 4D along line D4-D4 illustrates the removal of the portions of orthogonal feature 410 that were over the spacer 408 and the feature 406.

Figure 4E:
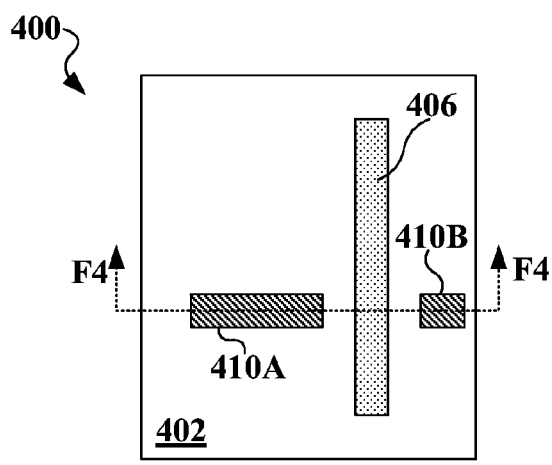
Figure 4F:
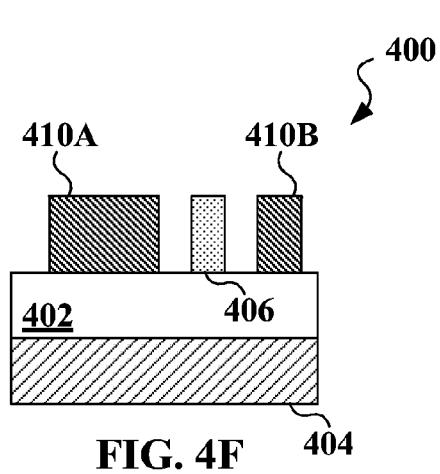

FIGS. 4E and 4F illustrate the wafer 400 after the selective removal of the spacer 408. This may be performed by a selective chemical etch that targets the material of the spacer 408. After the removal of the spacer 408, the orthogonal features 410A and 410B and the vertical feature 406 may be used as masking features to transfer a pattern into the material layer 402, with a separation distance between the vertical features and either of the orthogonal features 410A or 410B by about 20 to about 30 nanometers. This pattern includes the orthogonal feature 410B which may be an island feature having dimensions that may not be directly, reliably patternable in a traditional photolithographic process. FIG. 4F shows the wafer 400 of FIG. 4E along a line F4-F4 thereof. Some embodiments of the wafer 400 may not include the feature 406, such that the spacer 408 is a stand-alone feature. In such embodiments, the spacer 504 may be formed within a trench in a material layer that is removed prior to the formation of the orthogonal feature 410 as seen in FIG. 4A.

Figure 5A:
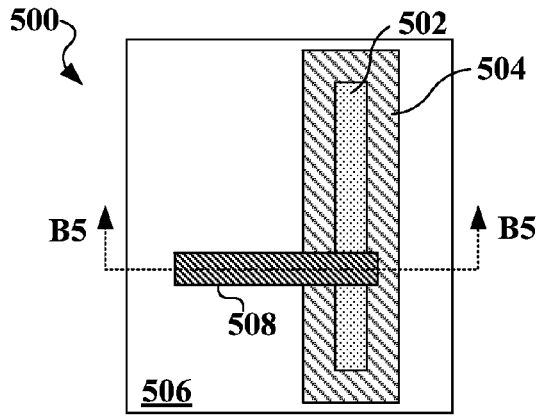
FIGS. 5A, 5B, 5C, 5D, 5E, and 5F present fragmentary views of a semiconductor wafer that includes a plurality of trenches during an additional fabrication process according to one or more embodiments of the present disclosure that results in an end-to-run feature.
Figure 5B:
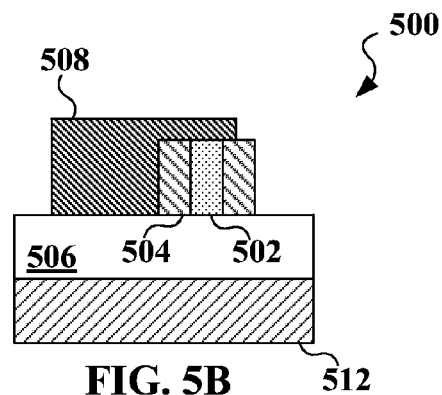

Referring now to FIGS. 5A-5F, these figures illustrate a wafer 500 at various steps in a fabrication process that results in an "end-to-run" feature. As illustrated in FIGS. 5A and 5B, a vertical feature 502 that is surrounded by a spacer 504 is formed over a material layer 506. After the patterning of the vertical feature 502 and the surrounding spacer 504, an additional layer is deposited and patterned to form the orthogonal feature 508. As illustrated, a portion of the orthogonal feature 508 is formed directly over the material layer 506, while another portion of the orthogonal feature 508 is formed directly over the spacer 504 and the vertical feature 502. Thus may be seen also in FIG. 5B, which is a cross-sectional illustration of the wafer 500 along a line B5-B5 of FIG. 5A. FIG. 5B also depicts a substrate 512 over which the material layer 506 is situated.

Figure 5C:
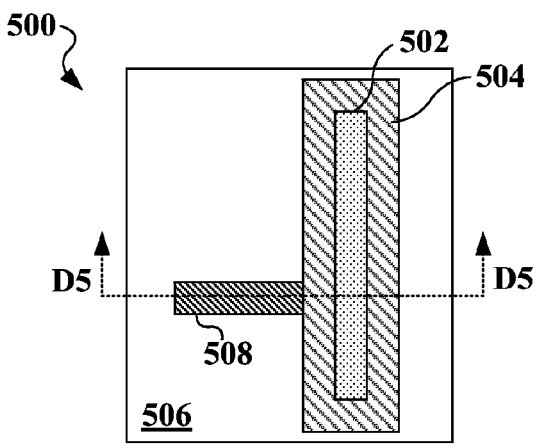
Figure 5D:
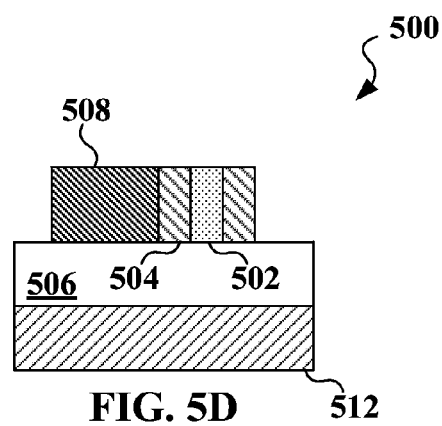

FIGS. 5C and 5D illustrate the wafer 500 after a back etch or CMP process removes the portion of the orthogonal feature 504 from over the spacer 504 and the vertical feature 502. FIG. 5D provides a cross-sectional view of the wafer 500 along a line D5-D5 as seen in FIG. 5C.

Figure 5E:
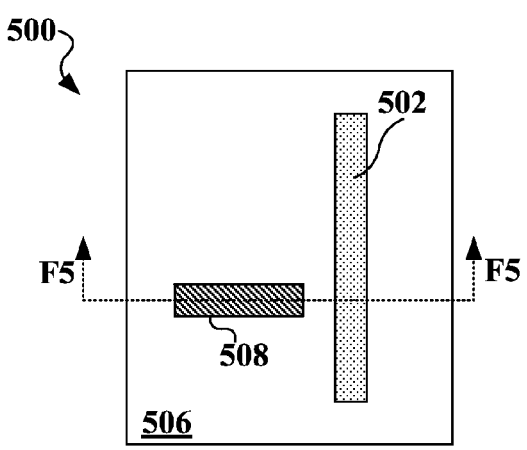
Figure 5F:
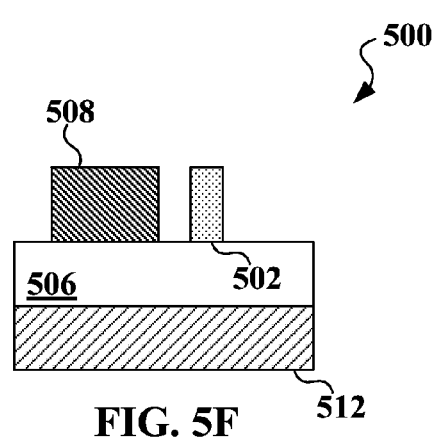

FIGS. 5E and 5F illustrate the wafer 500 after the spacer 504 is removed. Spacer 504 may be removed by a selective chemical etch process. After the removal of the spacer 504, the feature 502 and the remaining portion of the orthogonal feature 508 may form a mask that may be used to pattern the underlying material layer 506 in a chemical and/or physical etch process that results in a transfer of the desired layout (which includes the orthogonal feature 508 and the vertical feature 502) into material layer 506. One end of the orthogonal feature 508 is proximate to the length of the vertical feature 502, but separate by a distance approximately equal to a width of the spacer 504. In some embodiments the separation distance may be from about 20 to about 30 nanometers. This separation distance between the end of the orthogonal feature 508 and the run of the vertical feature 502 may not be directly realizable in a traditional photolithographic process. The separation distance between the orthogonal feature 508 and the vertical feature 502 is also depicted in FIG. 5F, which is a cross-sectional view along the line 5F-5F as seen in FIG. 5E. Some embodiments of the wafer 500 may not include the feature 502, such that the spacer 504 is a stand-alone feature. In such embodiments, the spacer 504 may be formed within a trench in a material layer that is removed prior to the formation of the orthogonal feature 508.

Figure 6A:
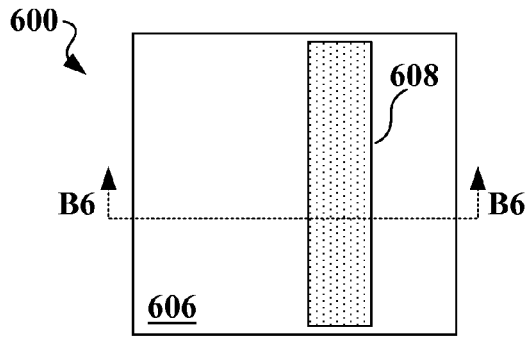
FIGS. 6A, 6B, 6C, 6D, 6E, 6F, 6G, and 6H present fragmentary views of a semiconductor wafer that includes a plurality of trenches during an additional fabrication process according to one or more embodiments of the present disclosure that uses a cut spacer feature.
Figure 6B:
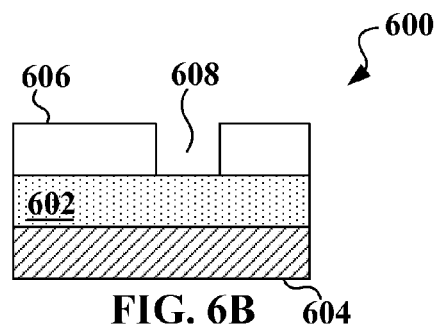

Referring now to FIGS. 6A-F, these figures illustrate a method of forming a small trench features in a target material layer. FIGS. 6A and 6B illustrate a wafer 600. The wafer 600 includes a target material layer 602. As shown in FIG. 6B, which is a cross-sectional view along a line B6-B6 of FIG. 6A, the target material layer 602 is situated over a substrate 608. A material layer 606 is formed over the target material layer 606 and is patterned to provide a trench feature 608. The trench feature 608 is patterned with a first sub-layout that is part of a desired layout pattern.

Figure 6C:
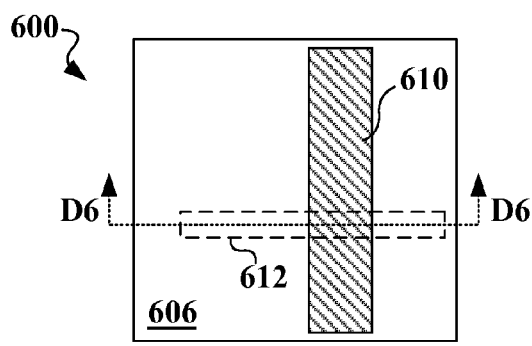
Figure 6D:
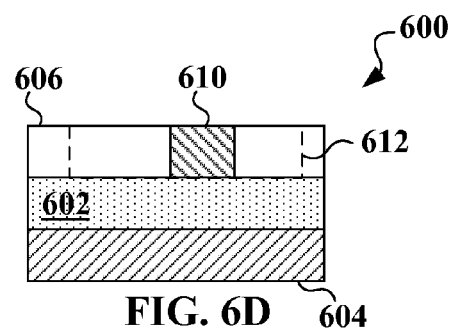

FIGS. 6C and 6D illustrate the wafer 600 after a spacer formation process that fills the trench 608 with a spacer material, such as silicon oxide, to form a spacer 610. In forming the spacer 610 as seen in FIGS. 6C and 6D, a layer of spacer material may be deposited over the surface of the material layer 606 and into the trench 608. Subsequently, the layer of spacer material is subjected to a CMP process that removes the portions outside the trench 608.

FIGS. 6C and 6D also show a second sub-layout that is part of the same desired layout at the first layout. The second sub-layout feature 612 covers a portion of the material layer 606 and the spacer 610.

Figure 6E:
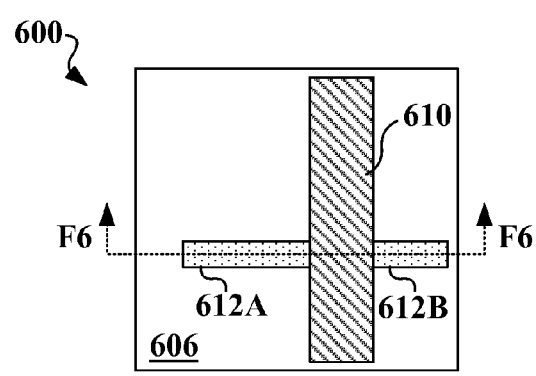
Figure 6F:
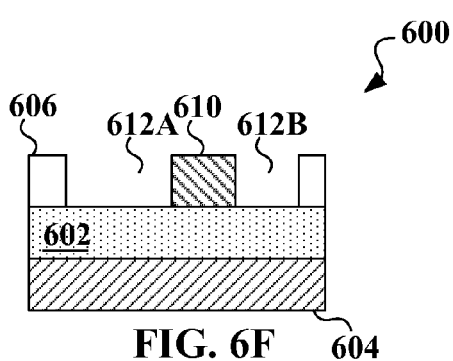
Figure 6G:
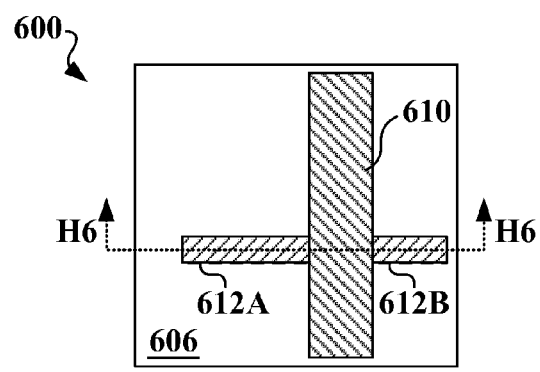
Figure 6H:
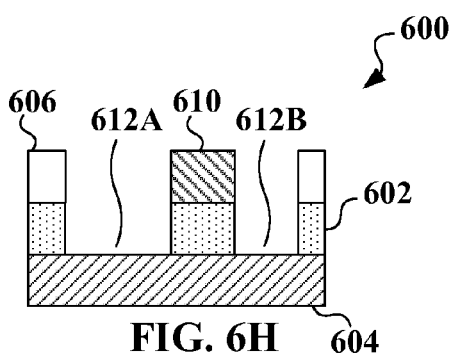

FIGS. 6E and 6F illustrate the wafer 600 after an etch process is used to transfer the second sub-layout 612 into the wafer 600 to form openings 612A and 612B. The etch process may be a selective etch process that does not substantially etch the spacer 610. The etch process may include a photolithography process to pattern a photoresist layer to serve as a mask. Because the spacer 610 is left in place, the openings 612A and 612B expose the target material layer 602, which may then be etched to form corresponding trenches or openings in the target material layer 602. This is illustrated in FIGS. 6G and 6H, which show the openings 612A and 612B extending through the target material layer 602, thereby exposing the substrate 604. In some embodiments of the wafer 600, the spacer 610 is removed prior to the patterning of the target material layer 602.

Referring now to FIGS. 7A-M, fragmentary views are of a semiconductor wafer 700 during a fabrication process are illustrated therein, in which an overlap is present between a first set of features and a subsequently formed feature. As discussed herein in connection with wafer 100 in FIGS. 1A-H, and applicable to other wafers herein as well, embodiments of this disclosure may provide a minimum spacing between the masking features formed in a first patterning process and those formed in a subsequent, second patterning process.

Figure 7A:
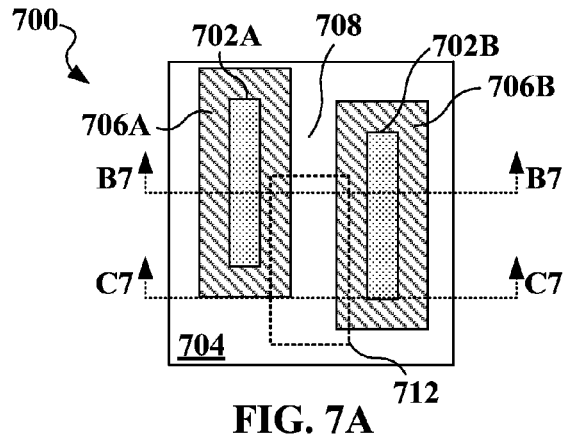
Figure 7B:
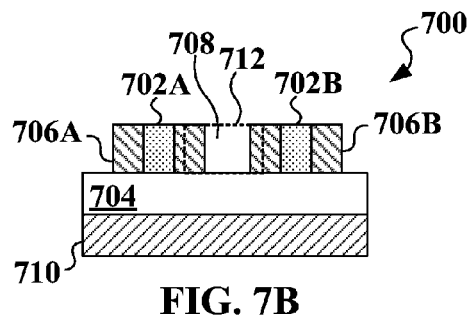
Figure 7C:
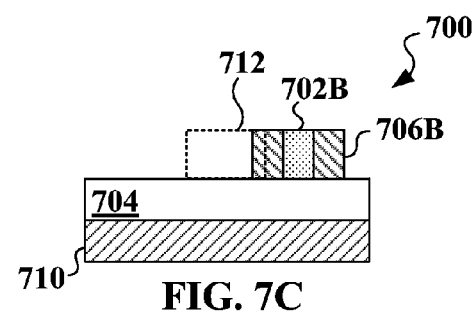

FIGS. 7A-C are a triplet of figures illustrating the formation of an a second feature formed from a mask that overlaps two earlier-formed features. As illustrated in FIGS. 7A, 7B, and 7C, a wafer 700 (only a portion of which is shown) includes two parallel features 702A and 702B that are formed over a material layer 704. Each of the features 702A and 702B is surrounded by a spacer similar to the spacers 108A-C of FIGS. 1C-F. Feature 702A is surrounded by a spacer 706A, and feature 702B is surrounded by a spacer 706B. Between the features 702A and 702B, there is a gap 708 defined between and by the spacers 706A and 706B. The gap is seen in cross-section in FIG. 7B, which illustrates a cross-section of the wafer 700 through the line B7-B7. FIG. 7B also illustrates that the material layer 704 is situated over a substrate 710. FIGS. 7A-C also illustrate a feature shape 712 that corresponds to a desired feature as present on a semiconductor mask. In some embodiments, the feature shape 712 overlaps the spacers 706A and 706B intentionally in order to generate a desired shape that is different from the feature shape 712 used to create the desired shape. The feature shape 712 may be understood as representing a mask. However, in other embodiments, the overlap between the feature shape 712 and the spacers 706A and 706B may be unintentional, e.g. the result of an alignment error between masks during fabrication. FIG. 7C illustrates a cross-sectional view of the wafer 700 along the line C7-C7 of FIG. 7A.

Figure 7D:
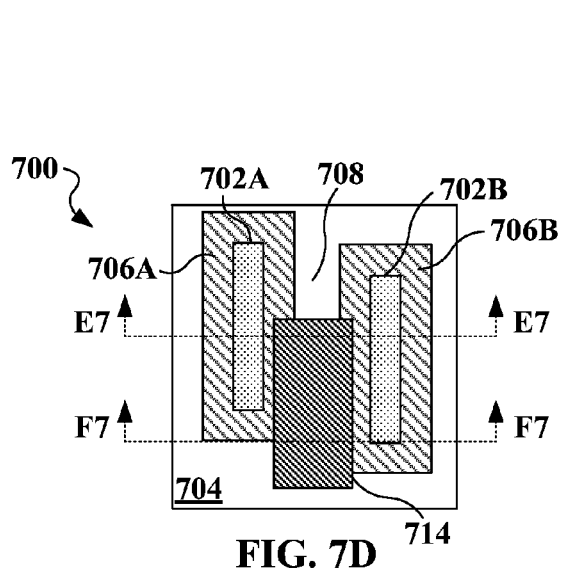
Figure 7E:
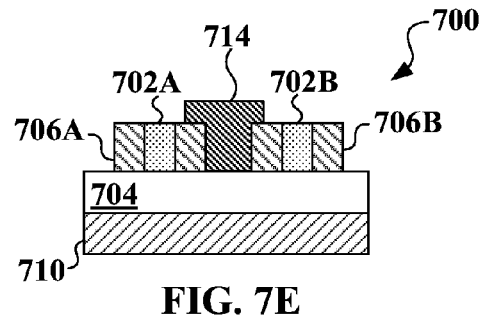
Figure 7F:
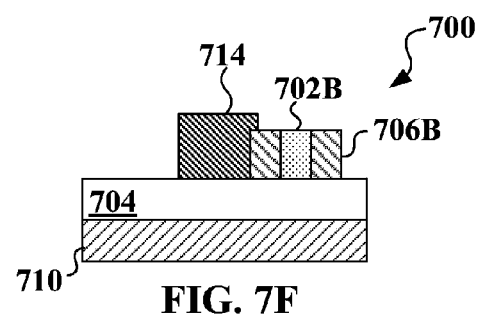

FIGS. 7D-F illustrates the result of the feature shape 712 being used to pattern a material layer deposited over the wafer 700, thereby forming a secondary feature 714 that overlaps both spacers 702A and 702B. The secondary feature 714 is also depicted in cross-section in FIGS. 7E and 7F as seen along lines E7-E7 and F7-F7, respectively. The secondary feature 714 fills a portion of the gap 708 between the spacers 706A and 706B and includes portions that overlaying the spacers 706A and 706B.

FIGS. 7G-I illustrate the wafer 700 and the secondary feature 714 after a planarization process, such as a CMP process. The planarization process removes the portions of the secondary feature that were illustrated as over the spacers 706A and 706B in FIGS. 7D-F. Thus, the footprint of the secondary feature 714 on the surface of the target material layer 704. FIGS. 7H and 7I illustrate different portions of the secondary feature 714 in cross-section along the lines H7-H7 and I7-I7, respectively. As illustrated, a width of the spacer 706A and a width of the spacer 706B is substantially the same. However, in some embodiments according to the present disclosure, spacer 706A may have a smaller width than that of spacer 706B or spacer 708B may have a smaller width than spacer 706A. For example, the spacer 706A and the spacer 706B may be formed in different regions of the wafer 700 that have had different spacer widths applied thereto.

FIGS. 7J-L illustrate the wafer 700 after the spacers 706A and 706B are removed. Because of the spacers 706A and 706B, a minimum spacing is provided between the secondary feature 714 and the features 702A and 702B. This minimum spacing may be smaller than a minimum feature size that can be provided by photolithographic patterning. This spacing is illustrated as the separation distance 716A between the secondary feature 714 and the feature 702A and as the separation distance 716B between the secondary feature 714 and the feature 702B. Because the width of spacers 706A and 706B, in the illustrated embodiment, resulted from a process that produced both spacers 706A and 706B, the separation distances 716A and 716B are equal. FIGS. 7J-L also illustrate the feature shape 712 of FIGS. 7A-C to illustrate how the spacers 706A and 706B shape the footprint of the secondary feature 714 as produced by the mask of feature shape 712. The secondary feature 714 is a notched feature, with the notches being defined by a uniform spacing between adjacent features 702A and 702B. The Features 702A, 702B, and 714, as seen in FIGS. 7J-L are then used to pattern the target layer 704.

In several embodiments described herein, a feature to be formed on a target material layer is formed in part over a spacer around another feature (formed in a preceding patterning process) and/or around the feature which the spacer surrounds. As seen in FIG. 3C, the additional feature 312A and three 312B have portions patterned over the spacers 306A and 306B, and as seen in FIG. 4A, the orthogonal feature 410 is formed such that it overlaps both the vertical feature 406 and the spacer 408 around the vertical feature 406. Additionally, as seen in FIG. 7D, the secondary feature 714 is formed such that it overlaps the spacer 706A on one side and the spacer 706B on the other side. As described herein, the overlap may occur due to a misalignment of layers, but it may also be integrated into the design and layout of a multiple patterning process.

Thus, some embodiments of the disclosure include a design and layout system. The design and layout system may be a computing system having one or more processors in communication with memory that stores data, files, and instructions that when executed cause the system to perform certain methods. The design and layout system may include a multiple-patterning-multiple-spacer (MPMS) layout tool and several other tools. The MPMS layout tool includes rules that permit the overlay of one patterning mask over another patterning mask, where both are submasks of a single desired layout that can then be transferred into a target material layer. For example a designer rule checker (DRC) tool may permit such occurrences in a layout. In some embodiments, the DRC tool may flag occurrences for review by an operator of the design and layout system. Additionally, an automatic placement and routing (APR) tool may include a corresponding application that automatically incorporates an overlapping scheme like that shown in FIGS. 7A-L or that provide manual layout guidance to designers. Thus, the design and layout system provides for a multiple patterning process in which the masking features are formed in multiple patterning steps. The features of a subsequent patterning step may partially overlap those formed as a result of a preceding patterning step and may be shaped thereby.

Figure 8:
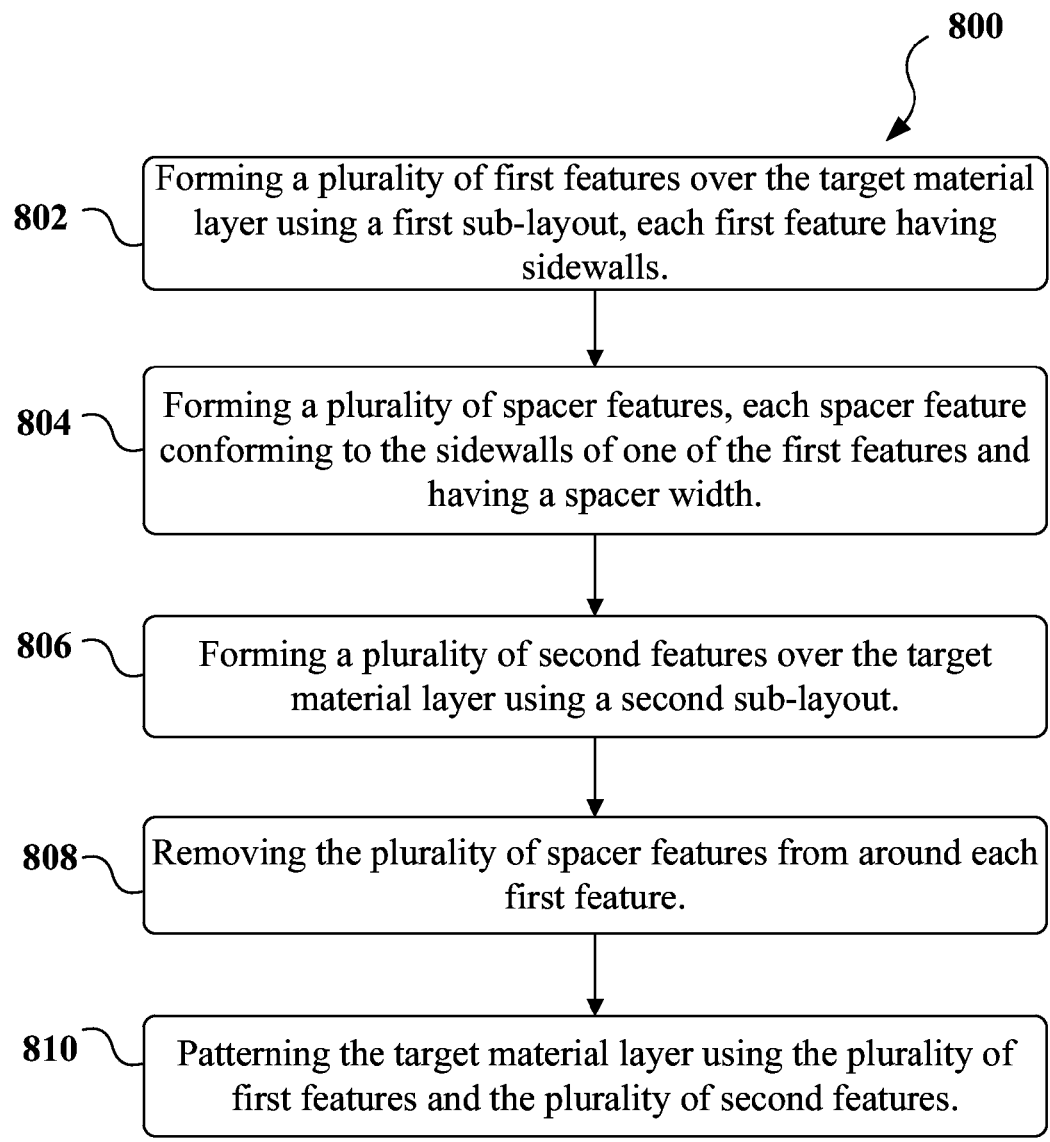
FIGS. 8 and 9 each present a flowchart of a method of patterning a target material layer on a semiconductor substrate according to one or more embodiments of the present disclosure.

FIG. 8 is a flowchart of a method 800 of patterning a target material layer on a semiconductor substrate. As illustrated, the method 800 includes a number of enumerated steps. Embodiments of the method 800 may include additional steps before, after, and in between the enumerated steps. Method of 800 may begin with a step 802 in which a plurality of first features is formed over a target material layer using a first sub-layout. Each of the first feature has sidewalls. In step 804, a plurality of spacer features is formed, with each spacer feature conforming to the sidewalls of one of the first features and having a spacer width. In step 806, a plurality of second features is formed over the target material layer using a second sub-layout. The first and second sub-layouts are part of a decomposed desired layout that it to be implemented using multiple patterning steps. In step 808, the plurality of spacer features is removed from around each first feature. And in step 810, the target material layer is patterned using the plurality of first features and the plurality of second features as masking features.

To better illustrate an embodiment of the method 800, reference is made to FIGS. 1A-F. In step 802, the features 104A, 104C, and 104D are formed over the material layer 102. The features 104A-C may be produced by a photolithographic process from a spun-on layer of photoresist or a similar polymer. Afterward in step 804, the spacers 108A, 108B, 108C may be formed by the deposition and patterned of a spacer layer. This may be done by the deposition of an oxide layer, with a subsequent etch step to remove the oxide or other suitable layer from the horizontal surfaces on the wafer 100. Alternatively, a CMP process may be used to eliminate topography and/or expose the top portions of the features 104A-C. The spacers have a uniform width around the features 104A-C. In some embodiments of spacers herein, like the spacers 108A, 108B, and 108C, the spacers may each be patterned with separate widths. For example, feature 104A may be intended for use in a first circuit, while feature 104C is intended for use in a second circuit. When the desired operational voltage of the first circuit is higher than that of the second circuit, the spacer 108A may have a larger spacer width than the spacer 108C. In this and other embodiments of the present disclosure, spacer widths may be determined by a process limitation, reliability limitations, and/or electrical limitations of the circuit being formed. In step 806, an additional material layer is deposited and patterned using a second sub-layout to form additional features 110A and 110B.

Additionally, some embodiments may contain more than two sub-layouts or submasks being used to pattern the material layer 102, such that the additional features 110A and 110B may be formed using separate submasks or one or more of the features 104A-C may be formed using more than one submask. In step 808, the spacers 108A-C are removed by a selective etch process. And in step 810, the features 104A-C and the additional features 110A and 110B, as well as any additional features, are used as masking features to pattern the material layer 102. Method 800 may also be performed wherein trenches are used to form the parallel features, such as is shown in FIGS. 2A-F and described above. Or having second features like features 312A and 312B of FIGS. 3A-H.

Figure 9:
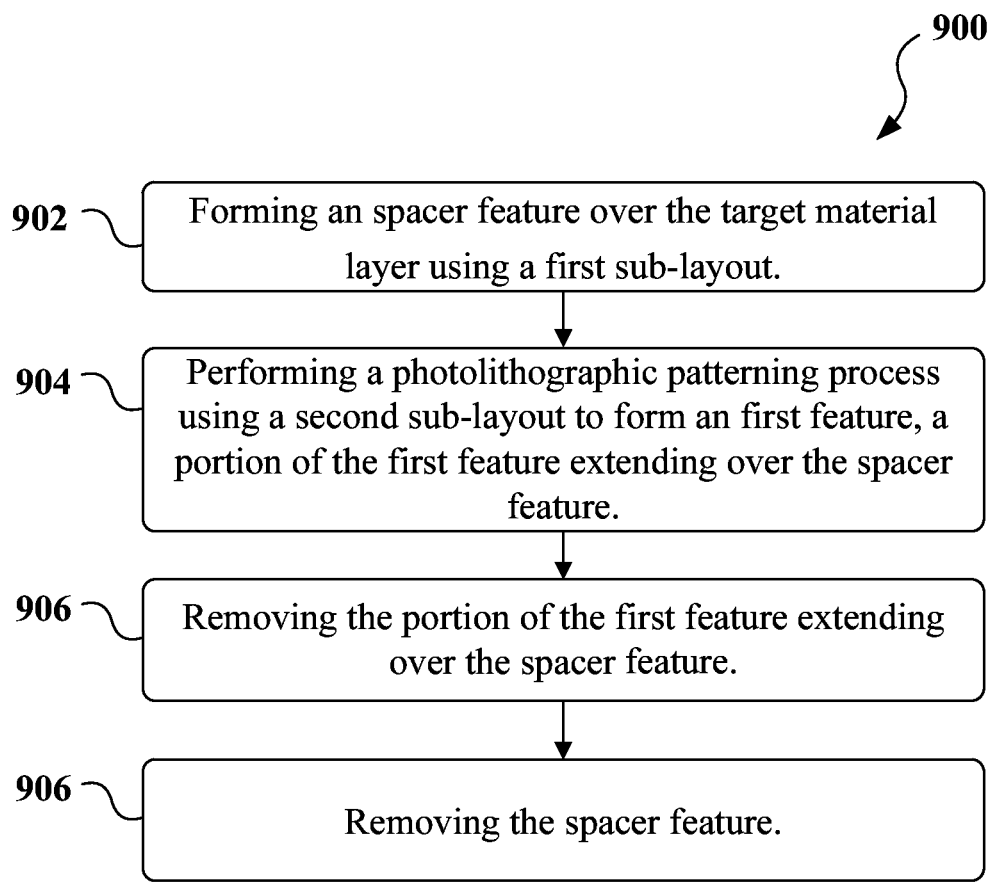

Referring now to FIG. 9, a flowchart of a method 900 of patterning a target material layer on a semiconductor substrate is illustrated therein. Like method 800, method 900 includes enumerated steps, and embodiments of method 900 may include additional steps before, after, and in between the enumerated steps. Thus, method 900 may begin in step 902, in which a spacer feature is formed over the target material layer using a first sub-layout. In step 904, a photolithographic patterning process is performed using a second sub-layout to form a first feature. A portion of the first feature extends over the spacer feature. In step 906, the thickness of the first feature is reduced by planarizing the first feature to a top of the spacer feature. In other words, portions of the first feature over a top of the spacer are removed. And in step 908, the spacer feature is removed, after which the target material layer is patterned.

To better describe the method 900, reference is now made to FIGS. 4A-F, although the method could also be described by references to FIGS. 5A-F and/or FIGS. 6A-F. The vertical feature 406 is formed over the material layer 402. The vertical feature 406 may be formed by depositing and patterning a material layer using a first submask corresponding to a first sub-layout. In step 902, the spacer 408 is formed surrounding the vertical feature 408, such that the inner geometry to the spacer is determined by the first sub-layout as realized in the vertical feature 406. In step 904, the orthogonal feature 410 is formed by material deposition and photolithographic patterning using a second sub-layout. The first and second sub-layouts are derived from a single desired layout that may not be reliably reproduced using a single mask. As seen in FIGS. 4A and 4B, a portion of the orthogonal feature 410 extends over the spacer feature 408 and the vertical feature 406. In step 906, the portion of the orthogonal feature 410 that extends over the spacer feature 408 is removed, as is seen in FIGS. 4C and 4D. The portion is removed by a planarization process as illustrated in FIGS. 4C and 4D. Then in step 908, the spacer 408 is removed from over the material layer 402. The orthogonal feature 410 is divided into two portions, an orthogonal feature 410A and an orthogonal feature 410B. The lengths of the separate orthogonal features 410A and 410B are shorter than a length of the original orthogonal feature 410. However, as seen in FIGS. 5A-F, the orthogonal feature is not divided in some embodiments.

In some embodiments of the method 900, the orthogonal feature 410 is shortened, but not divided into two portions. As seen in FIGS. 5A-F, the orthogonal feature is not divided in some embodiments. And in some embodiments, more similar to that shown in FIGS. 6A-F, no vertical feature 406 is surrounded by the spacer feature 408. Rather the spacer feature 408 is formed as a stand-alone feature to be used as a cut layer. Using the vertical feature, if present, and the orthogonal feature or features as masking features, the target material layer 402 is patterned by an etch process.

The foregoing outlines features and methods that may permit better control of feature size and reproducibility during semiconductor device fabrication using multiple patterning steps to transfer a single desired layout into a target material layer. The performance of the foregoing may entail modifications to a design rule check (DRC) tool used during the layout processes. The foregoing outlines features of several simplified embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed to a method of patterning a target material layer on a semiconductor substrate. The method includes steps of forming a plurality of first features over the target material layer using a first sub-layout, with each first feature having sidewalls, of forming a plurality of spacer features, with each spacer feature conforming to the sidewalls of one of the first features and having a spacer width, and of forming a plurality of second features over the target material layer using a second sub-layout. The method further includes steps of removing the plurality of spacer features from around each first feature and of patterning the target material layer using the plurality of first features and the plurality of second features.

In another exemplary aspect, the present disclosure is directed to another method of patterning a target material layer on a semiconductor substrate. The method includes steps of forming a spacer feature over the target material layer using a first sub-layout and of performing a photolithographic patterning process using a second sub-layout to form a first feature. A portion of the first feature extending over the spacer feature. The method further includes steps of removing the portion of the first feature extending over the spacer feature and of removing the spacer feature.

In yet another exemplary aspect, the present disclosure is directed to a patterned semiconductor wafer. The patterned semiconductor wafer includes a semiconductor substrate with a target material layer formed over the substrate. A plurality of first features is formed over the substrate. The plurality of first features is formed using a first sub-layout. The patterned semiconductor wafer also includes a plurality of spacers with a spacer formed around each of the first features and a second feature formed over the substrate. The second feature includes a notch produced by one of the plurality of spacers.

What is claimed is:

1. A method of patterning a target material layer on a semiconductor substrate, the method comprising:
    forming a plurality of first features over the target material layer using a first sub-layout, each first feature having sidewalls;
    forming a plurality of spacer features, each spacer feature conforming to the sidewalls of one of the first features and having a spacer width;
    exposing a surface of the target material layer;
    forming a plurality of second features directly in contact with the target material layer using a second sub-layout;
    removing the plurality of spacer features from around each first feature; and
    patterning the target material layer using the plurality of first features and the plurality of second features.

2. The method of claim 1, wherein the plurality of second features is formed such that a gap separates at least some of the plurality of second features from the plurality of spacer features.

3. The method of claim 1, wherein at least one second feature is formed with a portion of the second feature over at least one of the spacer features.

4. The method of claim 3, wherein the portion of the second feature over at least one of the spacer features from over the at least one of the spacer features is removed prior to the patterning the target material layer using the plurality of first features and the plurality of second features.

5. The method of claim of claim 4, wherein the portion of the second feature is removed by a chemical-mechanical planarization process.

6. The method of claim 1, wherein the plurality of first features are trenches formed within a material layer over the target layer, and the plurality of spacer features are formed within the trenches.

7. The method of claim 1, wherein forming a plurality of second features comprises:
 depositing a first material layer over the plurality of first features and the plurality of spacer features, wherein a gap is present between two of the spacer features; and
 patterning the first material layer such that a first portion of the first material layer extends within the gap and a second portion includes material extending over the two of the spacer features, the second portion being orthogonal to the first portion, the first portion and the second portion forming one of the second features.

8. The method of claim 7, further comprising removing the second portion.

9. The method of claim 1, wherein forming the plurality of second features comprises:
 depositing a photoresist layer; and
 patterning the photoresist layer using a mask having shapes defining the plurality of second features.

10. A method of patterning a target material layer on a semiconductor substrate, the method comprising:
 forming a plurality of first features over the target material layer using a first sub-layout, each first feature having sidewalls;
 forming a plurality of spacer features proximate to the first features and having a spacer width;
 exposing a surface of the target material layer between the plurality of spacer features;
 forming a plurality of second features directly on the surface of the target material layer using a second sub-layout;
 removing at least a portion of the plurality of spacer features; and
 patterning the target material layer using the plurality of first features and the plurality of second features.

11. The method of claim 10, wherein the plurality of second features is formed such that a gap separates at least some of the plurality of second features from the plurality of spacer features.

12. The method of claim 1, wherein at least one second feature is formed with a portion of the second feature over at least one of the spacer features, which is removed prior to the patterning the target material layer using the plurality of first features and the plurality of second features.

13. The method of claim 12, wherein the portion of the second feature is removed by a chemical-mechanical planarization process.

* * * * *